United States Patent
Nagata

(10) Patent No.: US 10,317,430 B2
(45) Date of Patent: Jun. 11, 2019

(54) CONTACTOR WITH A PLURALITY OF SPRINGS AND CONTACT POINT PORTIONS URGED BY THE SPRINGS

(71) Applicant: YOKOWO CO., LTD., Kita-ku, Tokyo (JP)

(72) Inventor: Takahiro Nagata, Tomioka (JP)

(73) Assignee: Yokowo Co., Ltd., Tokyo (JP)

(*) Notice: Subject to any disclaimer, the term of this patent is extended or adjusted under 35 U.S.C. 154(b) by 0 days.

(21) Appl. No.: 15/762,881

(22) PCT Filed: Sep. 6, 2016

(86) PCT No.: PCT/JP2016/076208
§ 371 (c)(1),
(2) Date: Mar. 23, 2018

(87) PCT Pub. No.: WO2017/056879
PCT Pub. Date: Apr. 6, 2017

(65) Prior Publication Data
US 2018/0275167 A1 Sep. 27, 2018

(30) Foreign Application Priority Data
Sep. 30, 2015 (JP) ................................ 2015-194768

(51) Int. Cl.
*G01R 1/067* (2006.01)
*G01R 1/073* (2006.01)
(Continued)

(52) U.S. Cl.
CPC ....... *G01R 1/06722* (2013.01); *G01R 1/0466* (2013.01); *G01R 1/067* (2013.01);
(Continued)

(58) Field of Classification Search
CPC .. G01R 1/06733; G01R 1/0466; G01R 1/067; G01R 1/073; G01R 1/7314; G01R 31/26;
(Continued)

(56) References Cited

U.S. PATENT DOCUMENTS 5,399,982 A * 3/1995 Driller ............... G01R 1/07378
29/705
5,955,888 A * 9/1999 Frederickson ..... G01R 31/2886
324/750.25
(Continued)

FOREIGN PATENT DOCUMENTS

JP H05-040131 A 2/1993
JP H09-184852 A 7/1997
(Continued)

OTHER PUBLICATIONS

International Search Report dated Nov. 1, 2016, for corresponding International Patent Application No. PCT/JP2016/076208.
(Continued)

*Primary Examiner* — Harshad C Patel
(74) *Attorney, Agent, or Firm* — Morgan, Lewis & Bockius LLP

(57) ABSTRACT

Provided is a contactor that can be manufactured easily and secure a long stroke. A contactor includes: a flexible board; a plurality of contact point portions that are provided in the flexible board; a plurality of springs that urge the contact point portions respectively toward an inspection target device; and a housing that receives the plurality of springs. Each of the springs has a flat winding portion that is provided at least at an end portion of the spring on the contact point portion side, and a diagonal tight winding portion that is provided at a longitudinally intermediate portion of the spring. A gap is present between the flat
(Continued)

winding portion and the diagonal tight winding portion in an uncompressed state of the spring.

20 Claims, 3 Drawing Sheets

(51) Int. Cl.
*G01R 31/26* (2014.01)
*G01R 1/04* (2006.01)
*G01R 31/28* (2006.01)
*H01R 12/70* (2011.01)
*H01R 12/87* (2011.01)
*H01R 13/24* (2006.01)

(52) U.S. Cl.
CPC .......... *G01R 1/073* (2013.01); *G01R 1/07314* (2013.01); *G01R 31/26* (2013.01); *G01R 31/2886* (2013.01); *H01R 12/7005* (2013.01); *H01R 12/87* (2013.01); *H01R 13/2421* (2013.01)

(58) Field of Classification Search
CPC  G01R 31/2866; H01R 12/7005; H01R 12/87; H01R 13/2421
USPC ............. 439/66, 83, 67; 324/754.14, 750.03, 324/750.25, 755.05
See application file for complete search history.

(56) References Cited

U.S. PATENT DOCUMENTS

| | | | | |
|---|---|---|---|---|
| 5,990,697 A * | 11/1999 | Kazama | ................. | G01R 1/067 324/72.5 |
| 6,174,172 B1 * | 1/2001 | Kazama | ................ | G01R 1/0466 439/66 |
| 6,464,511 B1 * | 10/2002 | Watanabe | .......... | G01R 1/07371 439/66 |
| 6,685,492 B2 * | 2/2004 | Winter | ................. | G01R 1/0466 324/754.08 |
| 6,900,651 B1 * | 5/2005 | Kazama | ............. | G01R 1/06716 324/754.14 |
| 6,953,348 B2 * | 10/2005 | Yanagisawa | ......... | G01R 1/0441 333/260 |
| 8,506,307 B2 * | 8/2013 | Henry | ................. | G01R 1/06738 439/66 |
| 2001/0040464 A1 | 11/2001 | Tanioka et al. | | |
| 2007/0018666 A1 * | 1/2007 | Barabi | ............... | G01R 1/06722 324/754.14 |
| 2008/0003849 A1 * | 1/2008 | Cherian | ............... | G01R 1/0466 439/82 |
| 2008/0048702 A1 * | 2/2008 | Nagata | ............... | G01R 1/06722 324/754.03 |
| 2009/0167335 A1 | 7/2009 | Yamada et al. | | |
| 2012/0142229 A1 * | 6/2012 | Henry | ................. | G01R 1/06738 439/709 |
| 2012/0202390 A1 * | 8/2012 | Park | ...................... | H01R 12/714 439/700 |
| 2013/0065455 A1 * | 3/2013 | Kawata | ................ | G01R 1/0483 439/700 |
| 2014/0247065 A1 * | 9/2014 | Yamada | ............. | G01R 1/06722 324/755.05 |

FOREIGN PATENT DOCUMENTS

| | | |
|---|---|---|
| JP | 2000-180506 A | 6/2000 |
| JP | 2004-309490 A | 11/2004 |
| JP | 2006-165414 A | 6/2006 |
| JP | 2007-078456 A | 3/2007 |
| JP | 2007-178405 A | 7/2007 |
| JP | 2009-094006 A | 4/2009 |
| JP | 2009-186210 A | 8/2009 |

OTHER PUBLICATIONS

Written Opinion of the International Searching Authority dated Nov. 1, 2016, for corresponding International Patent Application No. PCT/JP2016/076208.

* cited by examiner

CONTACTOR WITH A PLURALITY OF SPRINGS AND CONTACT POINT PORTIONS URGED BY THE SPRINGS

TECHNICAL FIELD

The present invention relates to a contactor preferably used for inspection of a device to be measured such as a semiconductor device.

BACKGROUND ART

A socket having a structure in which a plurality of contact probes are inserted into through holes of a housing, as shown in undermentioned Patent Document 1, has been known as a contactor used for inspection of an inspection target such as a semiconductor device. Each of the contact probes has a spring, and a plunger which is urged in a protrusion direction by the spring. Recent semiconductor devices have higher operating frequencies. In order to measure such a higher frequency, contact probes short in length have been put into use.

As a contactor having another structure, there has been provided a contact device having a structure in which a metal wire embedded sheet formed by embedding thin metal wires into an elastic material such as a silicon resin sheet is provided on a lower side of a contact sheet having a plurality of bumps (undermentioned Patent Document 2). The metal wire embedded sheet plays a role of not only making electric connection but also absorbing a variation in height among the bumps and non-coplanarity of the inspection target.

CITATION LIST

Patent Literature

Patent Document 1: JP-A-2009-186210
Patent Document 2: JP-A-2000-180506

SUMMARY OF INVENTION

Technical Problem

In the case of the structure of Patent Document 1, it is also difficult to handle the contact probes when the length of each of the contact probes is reduced in order to be adapted to the higher frequency. Specifically, operations of assembling the contact probes per se, and inserting the contact probes into the through holes of the housing, etc. becomes difficult, so that there is a problem that highly skillful techniques and lots of man-hours are required. In addition, it is also difficult to machine the plungers so that there is another problem that lots of time and cost are required. On the other hand, in the case of the structure of Patent Document 2, a long stroke cannot be secured because a stroke depends on an elastic deformation amount of the metal wire embedded sheet. Therefore, there is another problem that a stable contact cannot be obtained due to coplanarity of the device to be measured.

The present invention has been accomplished based on recognition of such situations. An object of the present invention is to provide a contactor which can be manufactured easily and which can secure a long stroke.

Means for Solving the Problem

An aspect of the present invention is a contactor. The contactor includes: a flexible board; a plurality of contact point portions that are provided in the flexible board; a plurality of springs that urge the contact point portions respectively toward a target; and a housing that receives the plurality of springs.

Each of the springs may have a flat winding portion that is provided at least at an end portion of the spring on a side of the contact point portion.

Each of the springs may have a diagonal tight winding portion that is provided at an intermediate portion of the spring in a longitudinal direction of the spring.

Each of the springs may have a flat winding portion that is provided at least at an end portion of the spring on the contact point portion side, and a diagonal tight winding portion that is provided at an intermediate portion of the spring in a longitudinal direction of the spring. A gap may be present between the flat winding portion and the diagonal tight winding portion when the spring is in an uncompressed state.

When each of the springs is compressed to a predetermined length, the gap may be eliminated to thereby bring the flat winding portion and the diagonal tight winding portion into contact with each other.

Each of the contact point portions may have a positioning protrusion that extends into an inside of a corresponding one of the springs.

By a mutual engagement between the positioning protrusion and the spring, retaining force may be generated to prevent the contact point portion from coming off the spring.

The housing may have a stopper protrusion that penetrates the flexible board to extend from one surface side of the flexible board toward the other surface side of the flexible board.

The flexible board may have through holes surrounding each of the contact point portions in order to prevent the flexible board from bending due to a difference in height among contact ends of the contact point portions.

A plurality of positioning pins may be provided in the housing and penetrate the flexible board to thereby position the flexible board with respect to the housing so that the flexible board is supported movably in a perpendicular direction to a face of the flexible board by the plurality of positioning pins.

The flexible board may have a plurality of elongated holes into which the positioning pins are respectively inserted, and each of the elongated holes may have a short dimension substantially the same as that of each of the positioning pins, and a lengthwise dimension larger than that of the positioning pin.

Incidentally, any combination of the aforementioned constituent elements, or any conversion of expression of the present invention into a method, a system, or the like, is also effective as a mode of the present invention.

Advantageous Effects of Invention

According to the present invention, it is possible to provide a contactor which can be manufactured easily and which can secure a long stroke.

DESCRIPTION OF EMBODIMENT

A preferred embodiment of the present invention will be described below in detail with reference to the drawings. Incidentally, identical or equivalent constituent elements, members, etc. shown in the respective drawings will be referenced correspondingly and respectively, and duplicate description thereof will be omitted suitably. In addition, the embodiment does not limit the present invention but is merely exemplified. All features or a combination thereof described in the embodiment does not have to be always essential parts of the present invention.

Figure 1:
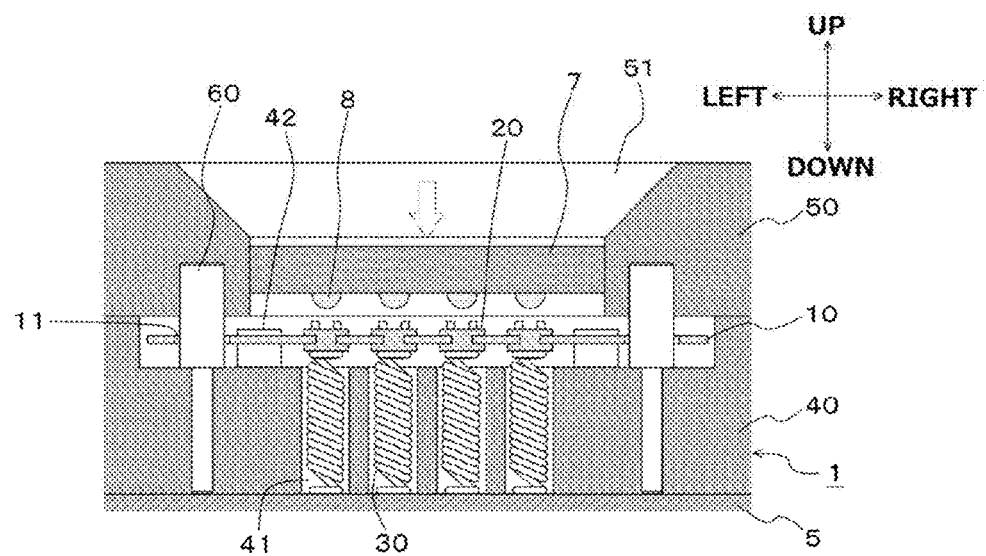
FIG. 1 A schematic sectional view of a contactor 1 in a state in which springs are uncompressed according to an embodiment of the present invention.
Figure 2:
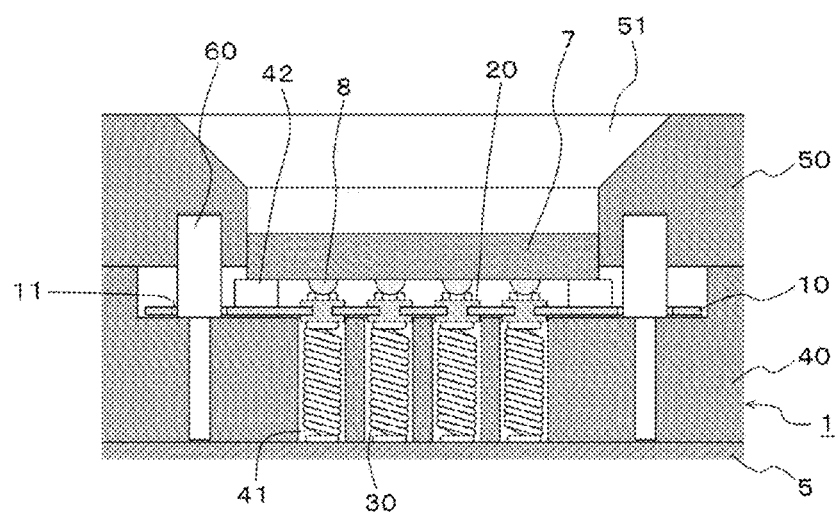
FIG. 2 A schematic sectional view of the contactor 1 in a state in which the springs are compressed.

Respective directions, i.e. up, down, left and right directions are shown in FIG. 1. In addition, a direction perpendicular to a paper surface in FIG. 1 is defined as front/rear direction. As shown in FIG. 1 and FIG. 2, a contactor 1 according to the embodiment is used for inspecting an inspection target device 7 such as a semiconductor device (IC package). The contactor 1 transmits power or signal between an inspecting substrate 5 of a not-shown inspecting apparatus and the inspection target device 7. Incidentally, the inspecting substrate 5 and the inspection target device 7 shown in FIG. 1 and FIG. 2 are not constituent elements of the contactor 1. The contactor 1 includes a flexible board 10, contact point portions 20, springs 30, a housing 40 and a guide 50.

Figure 5:
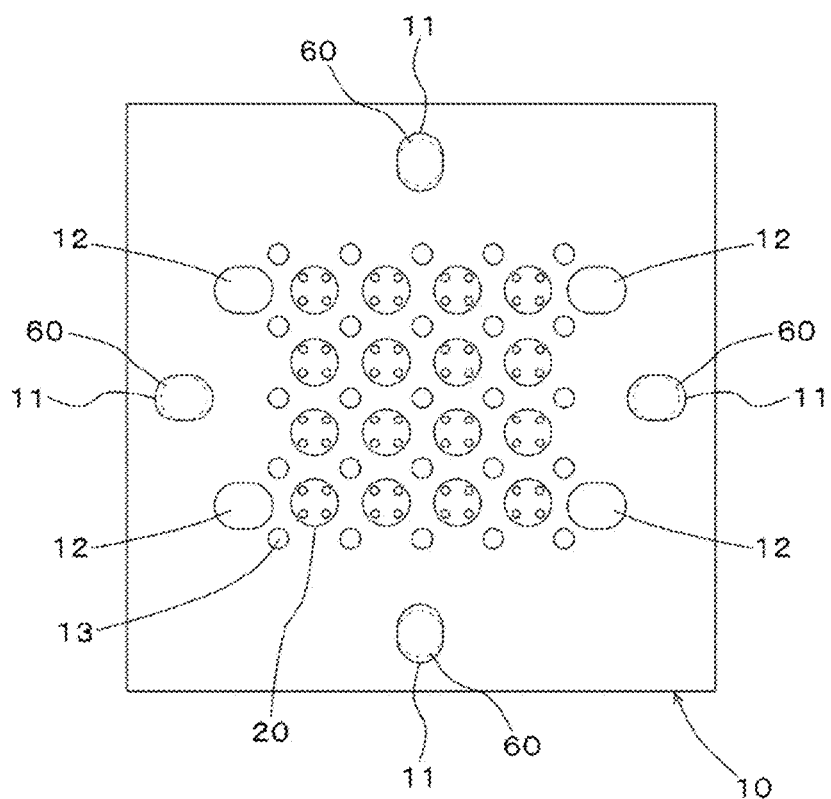
FIG. 5 A plan view of the flexible board 10 (a view seen from the side of an inspection target).

The flexible board 10 is a base member (polyimide etc.) for forming the contact point portions 20. The flexible board 10 faces an opening of a guide hole 51 of the guide 50. The flexible board 10 extends in a space between the housing 40 and the guide 50. As shown in FIG. 5, the flexible board 10 has through holes 13 surrounding each of the contact point portions 20. In an example of FIG. 5, four through holes 13 are provided to surround one contact point portion 20. Incidentally, the contact point portions 20 adjacent to one another share the through holes 13. Each of the through holes 13 has a role of preventing the flexible board 10 from bending (undulating) unpreparedly during inspection due to a difference in height (a variation in height) among contact ends of the contact points 20 (bumps 8 of the inspection target device 7 in FIG. 2).

By a plurality of (four in this case) positioning pins 60, the position of the flexible board 10 in the front, rear, left and right directions can be defined, and the flexible board 10 is supported movably in the up/down direction (a direction perpendicular to a face of the flexible board 10 itself). A plurality of pin insertion holes 11 of the flexible board 10 for respectively allowing the positioning pins 60 to penetrate thereinto are respectively elongated holes. By this structure, the flexible board 10 is allowed to bend during up/down movement. Incidentally, the positioning pins 60 are shown virtually by a broken line in FIG. 5 in order to show a size relationship between the pin insertion holes 11 and the pins 60. Each of the pin insertion holes 11 has a short dimension which is substantially the same as each of the positioning pins 60 and a lengthwise dimension which is larger than the positioning pin 60. As shown in FIG. 5, each of the pin insertion holes 11 provided in each of left and right portions of the flexible board 10 is an elongated hole which is long in the left/right direction. Each of the pin insertion holes 11 which is provided in each of front and rear portions of the flexible board 10 is an elongated hole which is long in the front/rear direction. By the four positioning pins 60, the flexible board 10 can be positioned accurately in the front, rear, left and right directions while being allowed to bend.

The flexible board 10 has a plurality of (four in this case) stopper holes 12 (FIG. 5) for respectively allowing stopper protrusions 42 of the housing 40 shown in FIG. 1 to penetrate thereinto. A size relationship between each stopper hole 12 and each stopper protrusion 42 is similar to the size relationship between each pin insertion hole 11 and each positioning pin 60. Thus, by the stopper protrusions 42, the flexible board 10 is allowed to bend during up/down movement.

Figure 3:
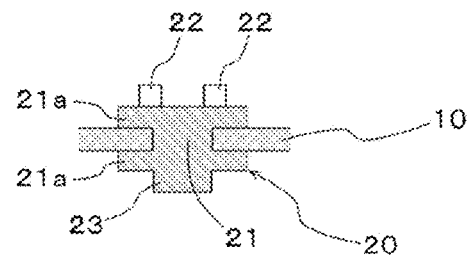
FIG. 3 An enlarged sectional view of a flexible board 10 in a vicinity of a contact point portion 20 in FIG. 1.
Figures 4A, 4B:
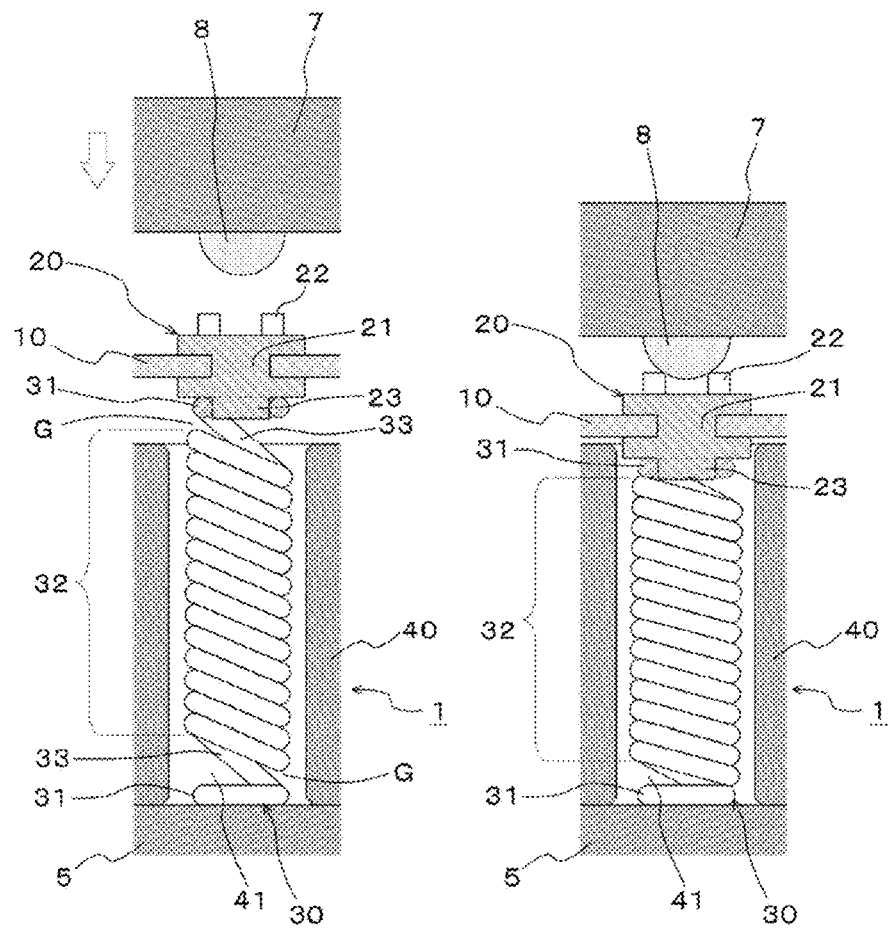
FIG. 4(A) is an enlarged sectional view of an important part of FIG. 1.
FIG. 4(B) is an enlarged sectional view of an important part of FIG. 2.
Figure 6:
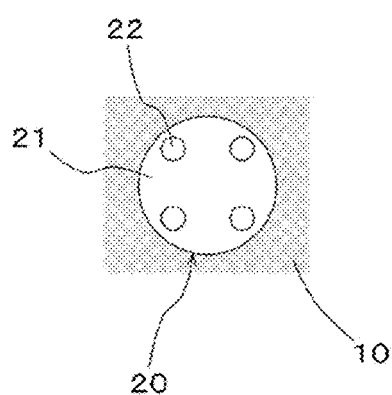
FIG. 6 An enlarged view of an important part of FIG. 5.

A plurality of (a large number of) the contact point portions 20 are made of a metallic member and provided on the flexible board 10, for example, by electroforming. The contact point portions 20 are to be brought in contact with the bumps (electrodes) 8 of the inspection target device 7 during inspection. As shown in FIG. 3, FIGS. 4(A) and 4(B), each of the contact point portions 20 has a body portion 21, contact protrusions 22, and a positioning protrusion (leg portion) 23. The body portion 21 is shaped like a circular cylinder, and has collar portions 21a respectively provided at upper and lower end portions of the body portion 21. The flexible board 10 is held between the collar portions 21a. On an upper surface side of the flexible board 10, each of the contact protrusions 22 protrudes upward from an upper surface of the collar portion 21a on an upper surface side of the body portion 21. The each of the contact protrusions 22 has, for example, a circular cylinder shape. For example, four contact protrusions 22 are provided in one contact point portion 20, as shown in FIG. 6. On a lower surface side of the flexible board 10, the positioning protrusion 23 protrudes downward from a central portion of a lower surface of the collar portion 21a on a lower surface side of the body portion 21, as shown in FIG. 3. The positioning protrusion 23 has, for example, in a circular cylinder shape. The positioning protrusion 23 extends into (enters) an inside of a corresponding spring 30, as shown in FIGS. 4(A) and 4(B). The positioning protrusion 23 is used for relative positioning between the contact point portion 20 and the spring 30 when the contactor 1 is assembled. At the same time, due to engagement (e.g. light press-fitting) of the positioning protrusion 23 with the spring 30, retaining force is generated to prevent the contact point portion 20 from coming off the spring 30.

The springs 30 are coil springs which are made of an electrically conductive material. The springs 30 of the same number as the contact point portions 20 are provided. The springs 30 respectively urge the contact point portions 20 toward the inspection target. Since the springs 30 support the contact point portions 20 from below, the flexible board 10 is supported in a floating state from a face of the housing 40 on which the flexible board 10 is disposed. The flexible board 10 is not supported fixedly to the housing 40. As shown in FIGS. 4(A) and 4(B), each spring 30 has flat winding portions 31 respectively provided at both end portions of the spring 30, and a diagonal tight winding portion 32 provided at an intermediate portion of the spring 30 in a longitudinal direction of the spring 30. The positioning protrusion 23 of the corresponding contact point portion 20 is fitted (lightly press-fitted) into an inside of the flat winding portion 31 on the upper end side. In an uncompressed state of each of the springs 30, a gap G is present between the flat winding portion 31 and the diagonal tight winding portion 32, as shown in FIG. 4(A). Specifically, in each of the springs 30, a connection portion 33 between one of the flat winding portions 31 and the diagonal tight winding portion 32 has an inclination steeper than the diagonal tight winding portion 32 when the spring 30 is in the uncompressed state. Thus, the aforementioned gap G is formed. On the other hand, when each of the springs 30 is compressed to a predetermined length, the gap G is eliminated to thereby bring the flat winding portion 31 and the diagonal tight winding portion 32 into contact with each other, as shown in FIG. 4(B). Incidentally, the flat winding portion 31 of the spring 30 is made smaller in diameter than the diagonal tight winding portion 32, for the purpose of making it surer to accommodate the flat winding portion 31 within a corresponding one of the through holes 41 of the housing 40 even when the flat winding portion 31 is expanded due to the positioning protrusion 23 of the contact point portion 20 press-fitted into the flat winding portion 31, and for the purpose of preventing the flat winding portion 31 from protruding from a corresponding one of not-shown electrodes of the inspecting substrate 5.

The housing 40 is made, for example, of an insulating resin, and accommodates the respective springs 30. Specifically, the housing 40 has the through holes 41 of the same number as the springs 30. Each of the springs 30 is accommodated in a corresponding one of the through holes 41. The housing 40 has a plurality of (four in this case) stopper protrusions (hard stops) 42 which penetrate the flexible board 10 and extend toward the upper surface side of the flexible board 10 from the lower surface side thereof. As shown in FIG. 2, the stopper protrusions 42 determine a lower limit position of the inspection target device 7 during inspection. The stopper protrusions 42 are designed to have such dimensions that the gap G as shown in FIG. 4(A) is eliminated in each of the springs 30 during the inspection target device 7 is moved down to be brought in contact with upper surfaces of the stopper protrusions 42 and becomes in a state for inspection.

The guide 50 is made, for example, of an insulating resin. The guide 50 has the guide hole 51 which determines the position of the inspection target device 7 in the front, rear, left and right directions during inspection and supports the inspection target device 7 movably in the up/down direction. The housing 40 and the guide 50 are fixed to each other by not-shown screws etc. The positioning pins 60 are fixed to the housing 40 at their lower ends by press-fitting etc., and fixed to the guide 50 at their upper ends by press-fitting etc. The positioning pins 60 penetrate the pin insertion holes 11 of the flexible board 10 in the space between the housing 40 and the guide 50.

The contactor 1 is assembled, for example, in the following procedure. First, the springs 30 are respectively inserted into the through holes 41 of the housing 40, and the positioning pins 60 are fixed to the housing 40 by press-fitting. On the other hand, a large number of the contact point portions 20 are collectively formed in the flexible board 10 by electroforming etc. in advance. The flexible board 10 is disposed on the springs 30 while the positioning pins 60 are made to penetrate the pin insertion holes 11. Thus, the positioning protrusions 23 of the contact point portions 20 are made to enter (are fitted into) insides of the flat winding portions 31 at the upper end portions of the springs 30. Successively, the guide 50 is fixed onto the housing 40 by screwing etc.

Inspection using the contactor 1 is performed, for example, in the following procedure. The contactor 1 is fixed in advance on the inspecting substrate 5 by screw fixing etc. As shown in FIG. 1, the inspection target device 7 is inserted into the guide hole 51 of the guide 50. As shown in FIG. 2, the inspection target device 7 is pressed toward the contact point portions 20. Then, the bumps 8 of the inspection target device 7 are brought in contact with the contact point portions 20 to thereby move the contact point portions 20 backward (downward) against urging forces of the springs 30. Thus, necessary sufficient contact forces between the bumps 8 and the contact point portions 20 can be obtained. In this state, the inspection target device 7 is inspected.

According to the embodiment, it is possible to obtain the following effects.

(1) A large number of the contact point portions 20 can be formed collectively in the flexible board 10, for example, by the electroforming technique. Accordingly, work for inserting plungers into the through holes 41 of the housing 40 individually is unnecessary. Thus, manufacturing can be easy, man-hours can be saved, and cost can be cheap.

(2) The contact point portions 20 are urged by the springs 30. With this configuration, it is possible to secure a longer stroke than in a configuration in which contact point portions are supported by a metal wire embedded sheet having elasticity as in Patent Document 2. Thus, it is possible to obtain a stable contact even when there is a variation in coplanarity among the bumps 8 of the inspection target device 7.

(3) Hardness of a silicon rubber sheet constituting the metal wire embedded sheet in Patent Document 2 varies at high temperature or low temperature. For this reason, there is a problem that it is not possible to obtain a stable contact due to a variation in pressing pressure under an environment of high temperature or low temperature. In contrast, according to the embodiment, it is possible to obtain the pressing pressure stably due to urging by the springs 30 even under the environment of high temperature or low temperature. Thus, stability of the contact is high. In addition, differently from the configuration of Patent Document 2, the present invention can withstand a large number of times of use without any life problem caused by fatigue of rubber.

(4) In each of the springs 30, the upper end portion which can be engaged with a corresponding one of the contact point portions 20 serves as the flat winding portion 31. Deterioration of the coplanarity of the contact point portions 20 can be suppressed due to urging by the springs 30. On the other hand, in each of the springs 30, its own longitudinally intermediate portion serves as the diagonal tight winding portion 32. Accordingly, the spring 30 can reduce a current path (electric length) while securing a stroke length. Here, due to the presence of the gap G between the flat winding portion 31 and the diagonal tight winding portion 32 as shown in FIG. 4A in the uncompressed state of the spring 30, it is possible to secure a longer stroke than in a case where the gap G is absent. Incidentally, the gap G is eliminated due to compression of the spring 30 during the inspection shown in FIG. 4(B). Accordingly, there is no problem that the electric length may be increased due to the gap G. Since an electric signal is transmitted through the tight winding portion, the electric length can be reduced and a high-speed signal of the inspection target device 7 can be transmitted to the inspecting substrate 5 with high quality.

Although the present invention has been described above using the embodiment as an example, it should be understood by those skilled in the art that each constituent element or each processing process in the embodiment can be modified variously within the scope of Claims. A modification will be mentioned as follows.

The number of the through holes 13, the number of the contact point portions 20, the number of the contact protrusions 22, the number of the springs 30, the number of turns in each of the flat winding portions 31, the number of the stopper protrusions 42, the number of the positioning pins 60, etc. in the flexible board 10 are not limited to the specific numeral values described in the embodiment but may be set suitably in accordance with design requirements or conveniences of individual products. Incidentally, when the flat winding portion 31 is set to have a plurality of turns, it is desirable that the turns of the flat winding portion 31 come into tight contact with one another at least when the spring 30 is compressed (during the inspection).

In accordance with requested specifications, configuration may be made as follows. That is, configuration may be made so that the diagonal tight winding portions 32 or the flat winding portions 31 are not provided in the springs 30, configuration may be made so that the gap G is not provided in a space between each of the flat winding portions 31 and each of the diagonal winding portions 32, configuration may be made so that the through holes 13 are not provided in the flexible board 10, configuration may be made so that the stopper protrusions 42 are not provided in the housing 40, configuration may be made so that the contact protrusions 22 or the positioning protrusions 23 are not provided in the contact point portions 20, etc.

REFERENCE SIGNS 1 contactor, 5 inspecting substrate, 7 inspection target device, 8 bump (electrode), 10 flexible board, 11 pin insertion hole, 12 stopper hole, 13 insertion hole, 20 contact point portion, 21 body portion, 21a collar portion, 22 contact protrusion, 23 positioning protrusion (leg portion), 30 spring, 31 flat winding portion, 32 diagonal tight winding portion, 33 connection portion, 40 housing, 41 through hole, 42 stopper protrusion, 50 guide, 51 guide hole, 60 positioning pin, G gap

The invention claimed is:

1. A contactor comprising:
   a flexible board configured to bend;
   a plurality of contact point portions provided on the flexible board;
   a plurality of springs that respectively urge the contact point portions toward a target; and
   a housing that accommodates the plurality of springs,
   wherein the flexible board is supported by positioning pins within the housing so as to move in a direction perpendicular to a face of the flexible board.

2. The contactor according to claim 1, wherein each of the springs includes a flat winding portion provided at least at an end portion of the spring on a side of the contact point portion.

3. The contactor according to claim 1, wherein each of the springs includes a diagonal tight winding portion provided at an intermediate portion of the spring in a longitudinal direction of the spring.

4. The contactor according to claim 1, wherein each of the springs includes:
   a flat winding portion provided at least at an end portion of the spring on a side of the contact point portion; and
   a diagonal tight winding portion provided at an intermediate portion of the spring in a longitudinal direction of the spring, and
   wherein a gap is present between the flat winding portion and the diagonal tight winding portion when the spring is in an uncompressed state.

5. The contactor according to claim 4, wherein, when each of the springs is compressed to a predetermined length, the gap is eliminated to thereby bring the flat winding portion and the diagonal tight winding portion into contact with each other.

6. The contactor according to claim 1, wherein each of the contact point portions includes a positioning protrusion that extends into an inside of a corresponding one of the springs.

7. The contactor according to claim 6, wherein, when the positioning protrusion and the spring are engaged with each other, a retaining force is generated to prevent the contact point portion from coming off the spring.

8. The contactor according to claim 1, wherein the housing includes a stopper protrusion that penetrates the flexible board to extend from one surface side of the flexible board to the other surface side of the flexible board.

9. The contactor according to claim 1, wherein the flexible board includes through holes surrounding each of the contact point portions in order to prevent the flexible board from bending due to a difference in height among contact ends of the contact point portions.

10. The contactor according to claim 1, further comprising:
    a plurality of positioning pins provided in the housing and penetrating the flexible board so as to position the flexible board with respect to the housing,
    wherein the flexible board is supported movably in a perpendicular direction to a face of the flexible board by the plurality of positioning pins.

11. The contactor according to claim 10, wherein the flexible board includes a plurality of elongated holes into which the positioning pins are respectively inserted, and
    wherein each of the elongated holes includes a short dimension substantially the same as that of each of the positioning pins, and a lengthwise dimension larger than that of the positioning pin.

12. The contactor according to claim 1, wherein the plurality of contact point portions provided on the flexible board by electroforming.

13. The contactor according to claim 1, wherein each of the plurality of contact point portions includes collar portions between which the flexible board is held.

14. The contactor according to claim 1, wherein each contact point portion includes a positioning protrusion, and each spring includes a flat winding portion at an end portion of the each spring on a side of the each contact point portion;
    when the positioning protrusion is press-fitted into the flat winding portion, the each contact point portion is prevented from coming off the each spring.

15. The contactor according to claim 1, further comprising a guide portion that is fixed onto the housing, and the guide portion includes a guide hole that determines an inspection position of the target.

16. A contactor comprising:
    a flexible board;
    a plurality of contact point portions provided on the flexible board;
    a plurality of springs that respectively urge the contact point portions toward a target; and
    a housing that accommodates the plurality of springs,
    wherein the housing includes a stopper protrusion that penetrates the flexible board to extend from one surface side of the flexible board to the other surface side of the flexible board.

17. The contactor according to claim 16, wherein the plurality of contact point portions provided on the flexible board by electroforming.

18. The contactor according to claim 16, wherein each of the plurality of contact point portions includes collar portions between which the flexible board is held.

19. The contactor according to claim 16, wherein each contact point portion includes a positioning protrusion, and each spring includes a flat winding portion at an end portion of the each spring on a side of the each contact point portion;
  when the positioning protrusion is press-fitted into the flat winding portion, the each contact point portion is prevented from coming off the each spring.

20. A contactor comprising:
  a flexible board;
  a plurality of contact point portions provided on the flexible board;
  a plurality of springs that respectively urge the contact point portions toward a target; and
  a housing that accommodates the plurality of springs,
  wherein the flexible board includes through holes surrounding each of the contact point portions in order to prevent the flexible board from bending due to a difference in height among contact ends of the contact point portions.

* * * * *